(12) United States Patent
Moors et al.

(10) Patent No.: US 9,540,982 B2
(45) Date of Patent: Jan. 10, 2017

(54) EXHAUST TRAIN HAVING AN INTEGRATED THERMOELECTRIC GENERATOR

(75) Inventors: Juergen Moors, Neustadt (DE); Martin Gaertner, Worms (DE); Georg Degen, Lorsch (DE); Henry Bosch, Calw (DE); Roland Gauss, Simmersfeld-Oberweiler (DE); Karl Stockinger, Ebhausen (DE)

(73) Assignees: BASF SE, Ludwigshafen (DE); Friedrich Boysen GmbH & Co. KG, Altensteig (DE)

( * ) Notice: Subject to any disclaimer, the term of this patent is extended or adjusted under 35 U.S.C. 154(b) by 0 days.

(21) Appl. No.: 14/004,477

(22) PCT Filed: Mar. 16, 2012

(86) PCT No.: PCT/IB2012/051264
§ 371 (c)(1),
(2), (4) Date: Sep. 11, 2013

(87) PCT Pub. No.: WO2012/127386
PCT Pub. Date: Sep. 27, 2012

(65) Prior Publication Data
US 2014/0000249 A1    Jan. 2, 2014

(30) Foreign Application Priority Data
Mar. 18, 2011   (EP) .................................... 11158782

(51) Int. Cl.
*F01N 3/00*       (2006.01)
*F01N 3/02*       (2006.01)
(Continued)

(52) U.S. Cl.
CPC ............... *F01N 5/025* (2013.01); *H01L 35/30* (2013.01); *H01L 35/32* (2013.01); *Y02T 10/16* (2013.01)

(58) Field of Classification Search
CPC .... F01N 5/025; F01N 2240/02; F01N 3/2889; Y02T 10/16; H01L 35/30
(Continued)

(56) References Cited

U.S. PATENT DOCUMENTS 4,275,259 A    6/1981   Yamamoto et al.
4,463,214 A *   7/1984   Lowther ....................... 136/208
(Continued)

FOREIGN PATENT DOCUMENTS

CH    1794557    6/2006
CN    1652370    6/2006
(Continued)

OTHER PUBLICATIONS

International Search Report Issued Jul. 26, 2012 in PCT/IB12/51264 Filed Mar. 16, 2012.
(Continued)

*Primary Examiner* — Audrey K Bradley
*Assistant Examiner* — Diem Tran
(74) *Attorney, Agent, or Firm* — Oblon, McClelland, Maier & Neustadt, L.L.P.

(57) ABSTRACT

In an exhaust train for an internal combustion engine having an integrated thermoelectric generator, the exhaust train has at least one duct, through which exhaust gas flows and in which at least one thermoelectric module is arranged in such a way that the hot side of the thermoelectric module is in direct contact with the exhaust gas, while the cold side of the thermoelectric module is cooled by means of a heat transfer medium.

12 Claims, 5 Drawing Sheets

(51) Int. Cl.
*F01N 5/02* (2006.01)
*H01L 35/30* (2006.01)
*H01L 35/32* (2006.01)

(58) Field of Classification Search
USPC .................................................. 60/298, 320
See application file for complete search history.

(56) References Cited

U.S. PATENT DOCUMENTS

| | | | |
|---|---|---|---|
| 6,096,966 A | 8/2000 | Nishimoto et al. | |
| 6,986,247 B1* | 1/2006 | Parise | 60/284 |
| 7,150,147 B2* | 12/2006 | Murata | 60/287 |
| 7,178,332 B2* | 2/2007 | Sasaki | 60/320 |
| 7,467,513 B2* | 12/2008 | Sasaki et al. | 60/320 |
| 7,687,704 B2* | 3/2010 | Shimoji et al. | 136/205 |
| 2005/0172993 A1 | 8/2005 | Shimoji et al. | |
| 2005/0217714 A1 | 10/2005 | Nishijima et al. | |
| 2009/0283126 A1 | 11/2009 | Rostek et al. | |
| 2011/0120106 A1 | 5/2011 | Brueck et al. | |
| 2011/0311421 A1* | 12/2011 | Backhaus-Ricoult | B01D 53/9477 423/213.2 |

FOREIGN PATENT DOCUMENTS

| | | |
|---|---|---|
| CN | 101575998 | 11/2009 |
| DE | 10 2006 057 662 | 6/2008 |
| JP | 2007-236122 | 9/2007 |
| WO | 2009 138412 | 11/2009 |

OTHER PUBLICATIONS

Office Action as received in the corresponding Chinese Patent Application No. 201280013398.1 dated Apr. 1, 2016 w/Partial English Translation.

* cited by examiner

EXHAUST TRAIN HAVING AN INTEGRATED THERMOELECTRIC GENERATOR

The invention relates to an exhaust train for an internal combustion engine having an integrated thermoelectric generator and to the use thereof to generate power from the heat of the exhaust gas.

Thermoelectric generators and Peltier arrangements as such have been known for a long time. p- and n-doped semiconductors that are heated on one side and cooled on the other side carry electric charges through an external circuit, allowing electrical work to be performed at a load in the circuit. The efficiency with which heat is converted into electrical energy here is limited thermodynamically by the Carnot efficiency. Thus, an efficiency of (1000−400): 1000=60% would be possible at a temperature of 1000 K on the hot side and 400 K on the "cold" side. However, so far it has only been possible to achieve efficiencies of up to 6%.

If, on the other hand, a direct current is applied to an arrangement of this kind, heat is transferred from one side to the other side. A Peltier arrangement of this kind operates as a heat pump and is therefore suitable for cooling equipment components, vehicles or buildings. Heating by means of the Peltier principle is also more advantageous than a conventional method of heating because more heat is transferred always than the energy equivalent supplied.

Currently, thermoelectric generators are used in space probes to generate direct currents, for cathodic corrosion protection of pipelines, for supplying energy to light and radio buoys or beacons and for operating radios and televisions. The advantages of thermoelectric generators lie in their extreme reliability. Thus they operate independently of atmospheric conditions such as atmospheric humidity; there is no fault-prone transfer of material but only charge transfer.

A thermoelectric module comprises p- and n-legs, which are connected electrically in series and thermally in parallel. FIG. 2 shows one such module.

The classic structure comprises two support plates, preferably ceramic plates, between which the individual legs are alternately applied. Two legs in each case are contacted in an electrically conductive manner by way of the end faces.

Apart from the electrically conductive contacting means, various additional layers are normally applied to the actual material, these layers serving as protective layers or as soldering layers. Ultimately, however, electrical contact between two legs is established by means of a metal bridge.

The contacting means is a significant element of thermoelectric components. The contacting means represents the physical link between the material at the "heart" of the component (which is responsible for the desired thermoelectric effect of the component) and the "external world". The structure of a contact of this kind is illustrated schematically in FIG. 1, and the structure of a thermoelectric module is illustrated in FIG. 2.

The thermoelectric material 1 within the component ensures the actual effect of the component. This is a thermoelectric leg. There is a flow of electric current and of heat through the material 1 to enable it to perform its function in the overall structure.

The material 1 is connected to the feed lines 6 and 7 on at least two sides by way of contacts 4 and 5. Here, layers 2 and 3 are intended to symbolize one or more intermediate layers (barrier material, solder, adhesion promoters or the like) that may be necessary between the material 1 and contacts 4 and 5. However, segments 2/3, 4/5, 6/7, which are each associated in pairs, do not have to be identical. Ultimately, this likewise depends on the specific structure and application, as does the direction of flow of the electric current and of heat through the structure.

An important role is played by contacts 4 and 5. These provide close contact between the material and the feed line. If the contacts are poor, severe losses occur here and may severely limit the power of the component. For this reason, the legs and contacts are often pressed onto the material in practice. The contacts are subject to severe mechanical loads. These mechanical loads increase even further as soon as higher (or indeed lower) temperatures and/or thermal cycling are involved. Thermal expansion of the materials incorporated into the component leads to mechanical stresses which, in extreme cases, lead to failure of the component due to the contact breaking off.

In order to prevent this, the contacts used must have a certain flexibility and spring properties to allow compensation of such thermal stresses.

In order to impart stability to the entire structure and to ensure the necessary thermal coupling over all the legs, which thermal coupling should be as homogeneous as possible, support plates of the kind shown in FIG. 2 are necessary. For this purpose, use is generally made of a ceramic, e.g. one composed of an oxide or nitride of $Al_2O_3$, $SiO_2$ or AlN.

There are often limits with respect to the use of the classic structure since it is only ever planar surfaces that can be brought into contact with the thermoelectric module. Close contact between the module surface and the heat source/heat sink is indispensable in order to ensure an adequate flow of heat.

Currently, attempts are being made to provide thermoelectric modules in the exhaust train or exhaust gas recirculation system of motor vehicles such as passenger cars and trucks in order to obtain electrical energy from some of the heat of the exhaust gas. In this case, the hot side of the thermoelectric element is connected to the exhaust gas or exhaust pipe while the cold side is connected to a cooling system. The amount of power that can be generated depends on the temperature of the exhaust gas and on the flow of heat from the exhaust gas to the thermoelectric material. In order to maximize the flow of heat, fittings are often installed in the exhaust pipe. However, these are subject to limitations since, for example, installing a heat exchanger often leads to a pressure loss in the exhaust gas, leading in turn to increased consumption by the internal combustion engine, something that cannot be tolerated.

In practice, the thermoelectric generator is usually installed in the exhaust train behind the exhaust catalytic converter. Together with the pressure loss in the exhaust catalytic converter, this often results in excessive pressure losses and, as a result, no heat-conducting fittings are provided in the exhaust train, with the thermoelectric module instead resting against the outside of the exhaust pipe. For this purpose, it is often necessary to give the exhaust pipe an angular cross section, thus enabling planar external surfaces to come into close contact with the thermoelectric material. However, up to now heat transfer has hardly been satisfactory.

The object of the present invention is the arrangement of a thermoelectric generator in an exhaust train for an internal combustion engine, the intention being that as large as possible a temperature difference should occur during the operation of the thermoelectric generator. In particular, the intention is to improve heat transfer from the exhaust gas to the thermoelectric generator.

According to the invention the object is achieved by an exhaust train for an internal combustion engine having an integrated thermoelectric generator, the exhaust train having at least one duct, through which exhaust gas flows and in which at least one thermoelectric module is arranged in such a way that the hot side of the thermoelectric module is in direct contact with the exhaust gas, while the cold side of the thermoelectric module is cooled by means of a heat transfer medium.

The at least one thermoelectric module preferably has p- and n-legs, which are connected electrically in series and thermally in parallel, and the contacting means of which rests against support plates on the hot and cold side of the thermoelectric module, the flow of exhaust gas impinging directly on the support plate on the hot side of the thermoelectric module.

The heat transfer—from the exhaust gas to the thermoelectric module on the hot side and from the thermoelectric module to the cooling medium on the cold side—is crucial for the provision of as large as possible a temperature difference for the thermoelectric module.

In the widest sense, the invention thus relates to exhaust gas heat utilization through direct conversion of thermal energy to electrical energy by thermoelectric generators. The thermoelectric generators consist of a heat source (exhaust gas), a thermoelectrically active module and a heat sink (cooling medium). For a large yield of electrical energy, there is therefore a need for as large as possible a temperature difference between the heat source and the heat sink and for a thermoelectric module with a high efficiency.

The present invention relates to a thermoelectric generator with improved heat transfer from the exhaust gas to the thermoelectric module, the improvement being achieved by placing the thermoelectrically active elements and/or the necessary contacting and insulating layers directly in the duct carrying exhaust gas.

The exhaust train according to the invention can have apertures into which the thermoelectric modules are inserted in encapsulated form, thus ensuring that the encapsulated thermoelectric module is in direct contact with the exhaust gas. The encapsulated thermoelectric modules used are installed gastightly relative to the exhaust train on their cold side.

Figure 1:
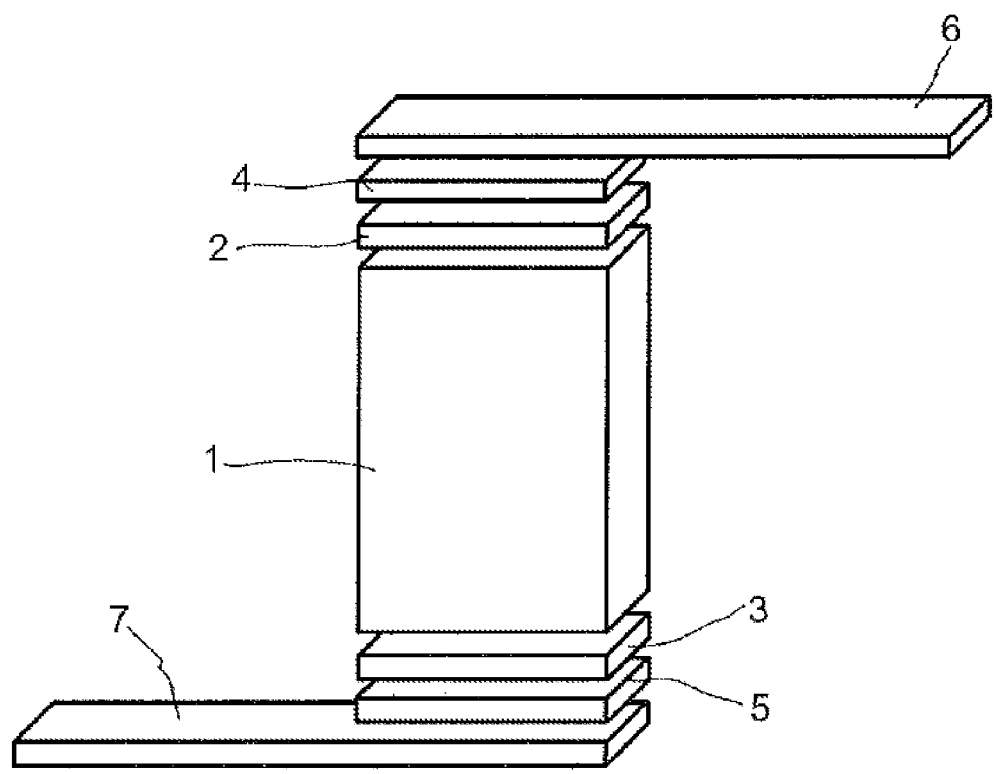
FIG. 1 shows s a structure of a contact part of a thermoelectric module.
Figure 2:
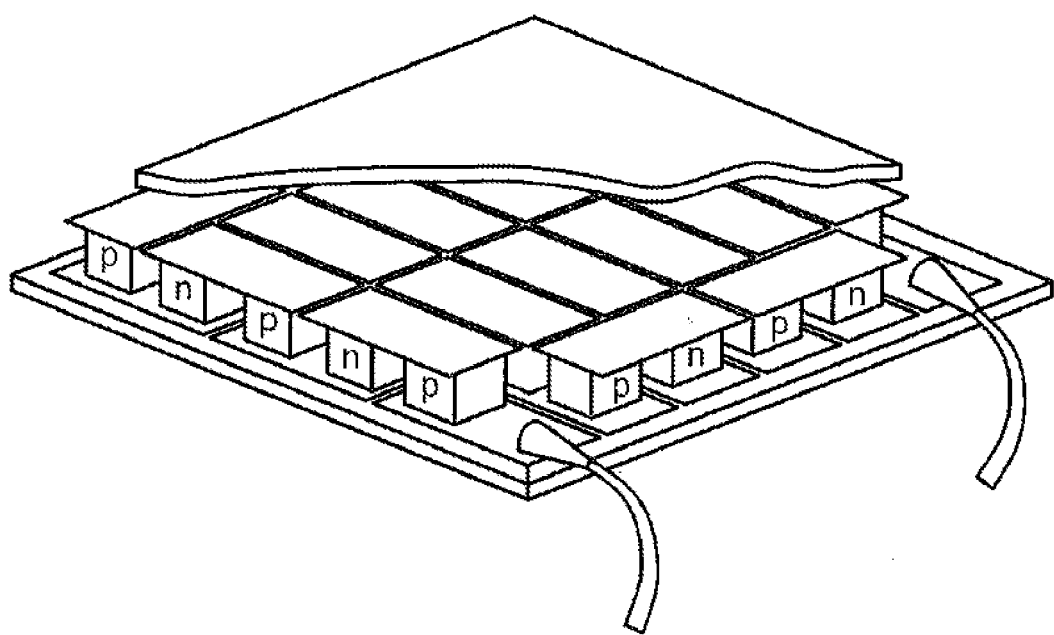
FIG. 2 shows a thermoelectric module comprises p- and n-legs, which are connected electrically in series and thermally in parallel.

The thermoelectric modules are constructed as described in the introduction to the description and as illustrated in FIGS. 1 and 2.

By virtue of the fact that the hot side of the thermoelectric module is in direct contact with the exhaust gas, heat transfer losses on the hot side of the thermoelectric module are minimized. In contrast, the thermoelectric module in the embodiments known hitherto is placed on the outside of the exhaust pipe, thereby significantly impairing heat transfer.

The thermoelectric modules generally have support or insulating plates on the surface in order to impart stability to the structure of the thermoelectric module and to ensure the necessary thermal coupling, which should be as homogeneous as possible, over all the legs.

According to the invention, it is possible to apply additional protective layers to these support plates as long as they do not significantly hinder heat transfer from the exhaust gas to the thermoelectric module. A covering consisting of a thin sheet metal layer can be provided, for example.

According to the invention, the term "exhaust train" is used to mean a section of the exhaust line of an internal combustion engine. However, the exhaust train can also be the entire portion starting from the outlet of the cylinder of the internal combustion engine to the end of the exhaust pipe. Exhaust catalytic converters and other fittings such as exhaust turbochargers or particulate filters can additionally be provided in the exhaust train, for example. The exhaust train according to the invention is arranged as close as possible to the outlet of the internal combustion engine in order to permit a high temperature difference in the thermoelectric material. The exact positioning along the exhaust train can depend on the stability and operating conditions of the respective thermoelectric material.

The exhaust train according to the invention has at least one duct, through which exhaust gas flows and in which the thermoelectric module is arranged. By way of example, the exhaust gas can be divided between a number of ducts into each of which a thermoelectric module is integrated. Thermoelectric modules arranged in adjacent ducts can have common contacting on the cold side with a heat transfer medium, for example.

In this arrangement, the duct can have any suitable cross section and longitudinal section. The at least one duct, through which the exhaust gas flows, preferably has a rectangular or trapezoidal cross section with substantially flat side walls, the thermoelectric generator being integrated into one or more of the flat side walls. For example, the thermoelectric modules can be integrated into two opposite side walls of the duct. In the region in which the thermoelectric modules are integrated, the exhaust train preferably has essentially a flattened cuboid shape, with the thermoelectric modules or generators being arranged on the flat sides of the cuboid, i.e. the sides with the largest surface area.

3 to 100 thermoelectric modules are preferably arranged in the exhaust train according to the invention. Preferably, 2 to 10, particularly preferably 3 to 5, layers of thermoelectric modules are present in the corresponding exhaust ducts.

A modular construction in which a plurality of thermoelectric modules of the same design are used and connected together in one thermoelectric generator is preferred.

The duct carrying exhaust gas preferably serves as a direct support for the thermoelectrically active elements and for the necessary insulating and contacting layers thereof. This makes it possible to dispense with separately packaged thermoelectric modules placed on the gas duct.

According to the invention, there is no need for any layers for gastight packaging of thermoelectric modules between the exhaust duct and the thermoelectrically active elements, which would inhibit the flow of heat. The at least one thermoelectric module is preferably incorporated gastightly into the at least one duct on the cold side of the at least one thermoelectric module. The packaging and gas tight sealing of the electrically active elements with respect to the "cold"

side and to the adjacent elements is thus accomplished by means of a covering which is open toward the hot side. As a result, the exhaust gas can enter unhindered into contact with the hot side of the thermoelectric module or material.

The exhaust train or duct through which the exhaust gas flows can be constructed from any suitable material. The gas duct is preferably constructed from sheet metal, cast material, machined bulk material or some other bulk material available as a solid body resistant to high temperatures.

Each gas duct preferably has a rectangular or trapezoidal cross section and a longitudinal section of the same configuration.

The electrically active elements can be provided in packages made from deep drawn metal sheets open toward the hot side, and the packages open toward the hot side can be sealed off gastightly with respect to the gas duct by welding, soldering, sintering, adhesive bonding or a material bond achieved in some other way.

According to the invention, the at least one duct or the ducts can have fittings which improve the approach flow of the exhaust gas to the at least one thermoelectric module. However, the pressure loss in the duct should not be significantly increased by such fittings. The pressure loss of the exhaust gases, more particularly exhaust gases from an internal combustion engine, flowing through the exhaust train according to the invention or ducts according to the invention should preferably not exceed 100 mbar, especially 50 mbar. Such pressure losses do not lead to increased fuel consumption by the internal combustion engine.

A plurality of thermoelectric modules can be present one behind the other and/or adjacent to one another in one plane in the thermoelectric generator.

A protective layer for protection against excessive temperatures can furthermore be provided on the thermoelectric module. This layer, which is also referred to as a "phase-change layer", is preferably constructed from inorganic metal salts or metal alloys with a melting point in a range of from 250° C. to 1700° C. Suitable metal salts are fluorides, chlorides, bromides, iodides, sulfates, nitrates, carbonates, chromates, molybdates, vanadates and wolframates of lithium, sodium, potassium, rubidium, cesium, magnesium, calcium, strontium and barium. Mixtures of suitable salts of this kind that form double or triple eutectics are preferably used as materials. They can also form quadruple or quintuple eutectics.

As alternative phase-change materials, it is possible to use metal alloys and combinations thereof that form double, triple, quadruple or quintuple eutectics, starting from metals such as zinc, magnesium, aluminum, copper, calcium, silicon, phosphorus and antimony. The melting point of the metal alloys should be in a range of from 200° C. to 1800° C.

The thermoelectric module can be encapsulated with the protective layer, especially when using metals such as nickel, zirconium, titanium, silver and iron or when using alloys based on nickel, chromium, iron, zirconium and/or titanium.

One or more of the thermoelectric modules according to the invention can be integrated into the exhaust train of the internal combustion engine, being connected in series for example. It is also possible in this context to combine thermoelectric modules with different thermoelectric materials. In general, it is possible to use any suitable thermoelectric material that is suitable for the temperature range of the exhaust gas from an internal combustion engine. Examples of suitable thermoelectric materials are skutterudites, e.g. $CoSb_3$, $RuPdSb_6$, $TX_6$ where T=Co, Rh, Ir and X=P, As, Sb; $X_2Y_8Z_{24}$ where X=a lanthanide, an actinide, an alkaline earth metal, an alkali metal, Th, an element of group IV; semi-Heusler compounds such as TiNiSn, HfPdSn and intermetallic alloys; clathrates such as $Zn_4Sb_3$, $Sr_8Ga_{16}Ge_{30}$, $Cs_8Sn_{44}$, $Co_4TeSb_4$; oxides such as $Na_xCoO_2$, $CaCo_4O_9$, $Bi_2Sr_2Co_2O_y Sr_2TiO_4$, $Sr_3Ti_2O_7$, $Sr_4Ti_3O_{10}$, $R_{1-x}M_xCoO_3$ where R=a rare earth metal and M=an alkaline earth metal; $Sr_{n+1}Ti_nO_{3n+1}$, where n is an integer; $YBa_2Cu_3O_{7-x}$; silicides such as $FeSi_2$, $Mg_2Si$, $Mn_{15}Si_{26}$; borides such as $B_4C$, $CaB_6$; $Bi_2Ce_3$ and derivatives thereof, PbCe and derivatives thereof, antimonides such as zinc antimonide, and Zintl phases such as $Yb_{14}MnSb_4$.

The exhaust train according to the invention is preferably installed in a motor vehicle. In this case, the exhaust train serves primarily for power generation from the heat of the exhaust gas.

In particular, the exhaust train according to the invention has the advantage that heat transfer losses between the exhaust gas and the thermoelectric module are minimized, thus enabling the efficiency of power generation to be improved.

Illustrative embodiments of the exhaust train according to the invention are explained in greater detail in the attached figures.

EXAMPLES

Figure 3:
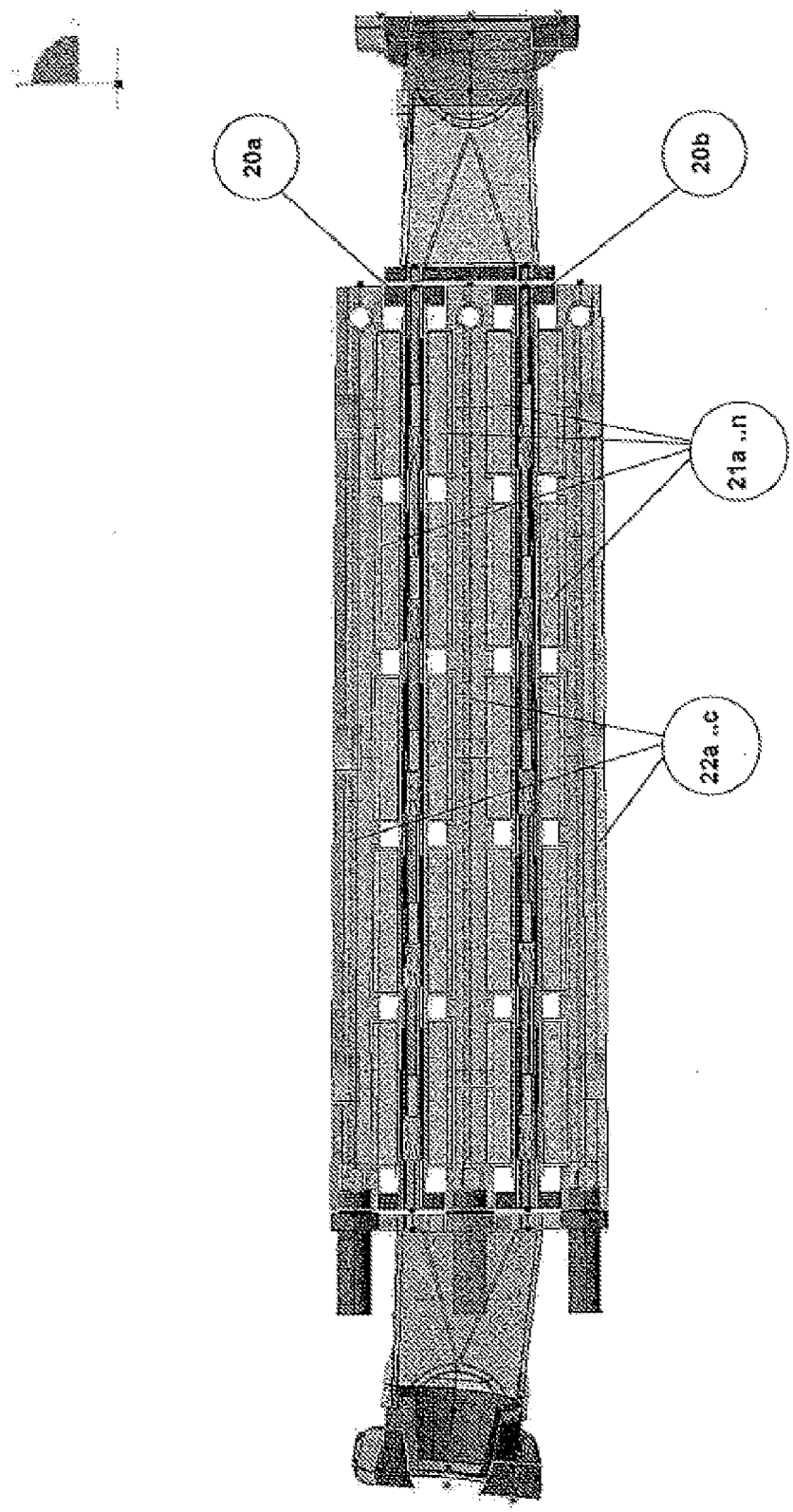
FIG. 3 shows a schematic cross section through an exhaust train according to the invention having a layered arrangement of two exhaust ducts.
Figure 4:
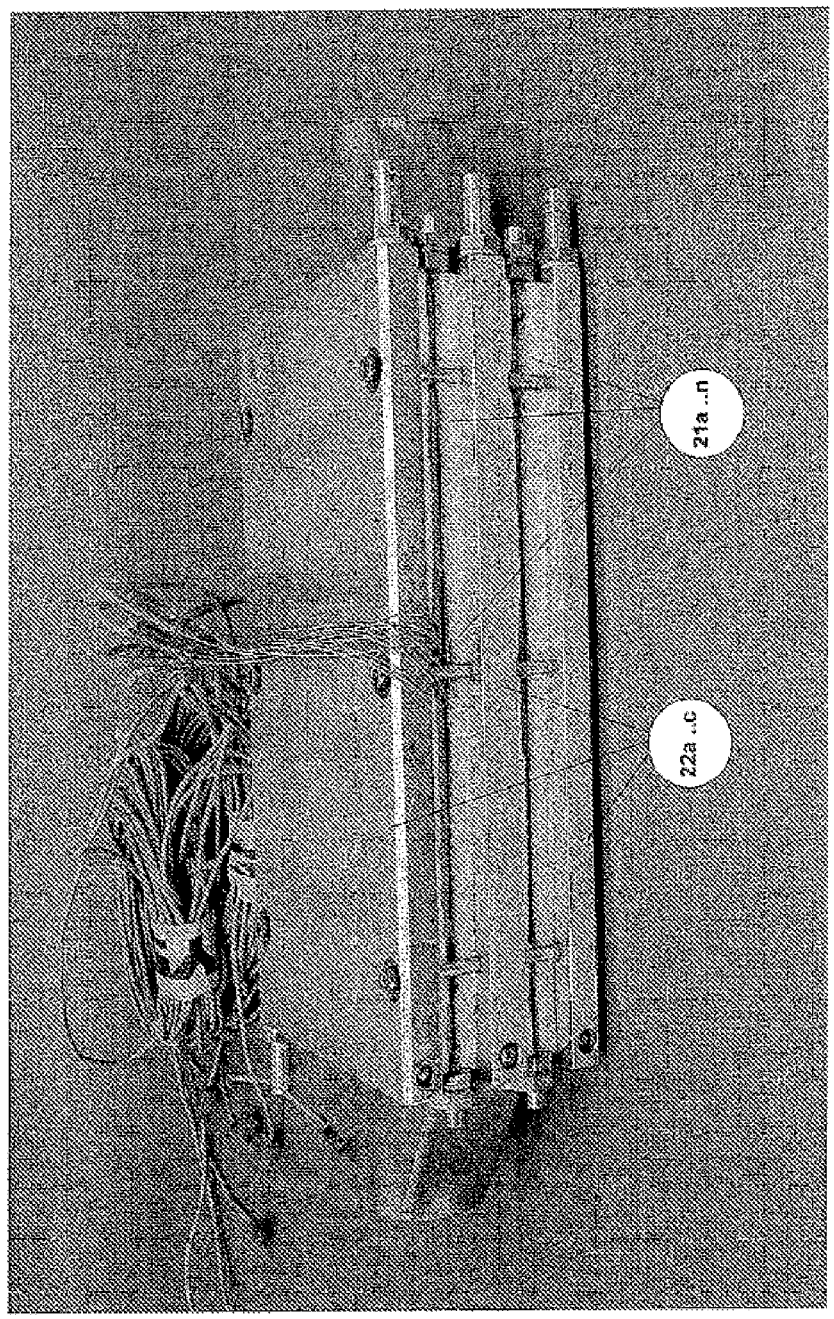
FIG. 4 shows an oblique view from above of an exhaust train of the kind illustrated schematically in FIG. 3.
Figure 5:
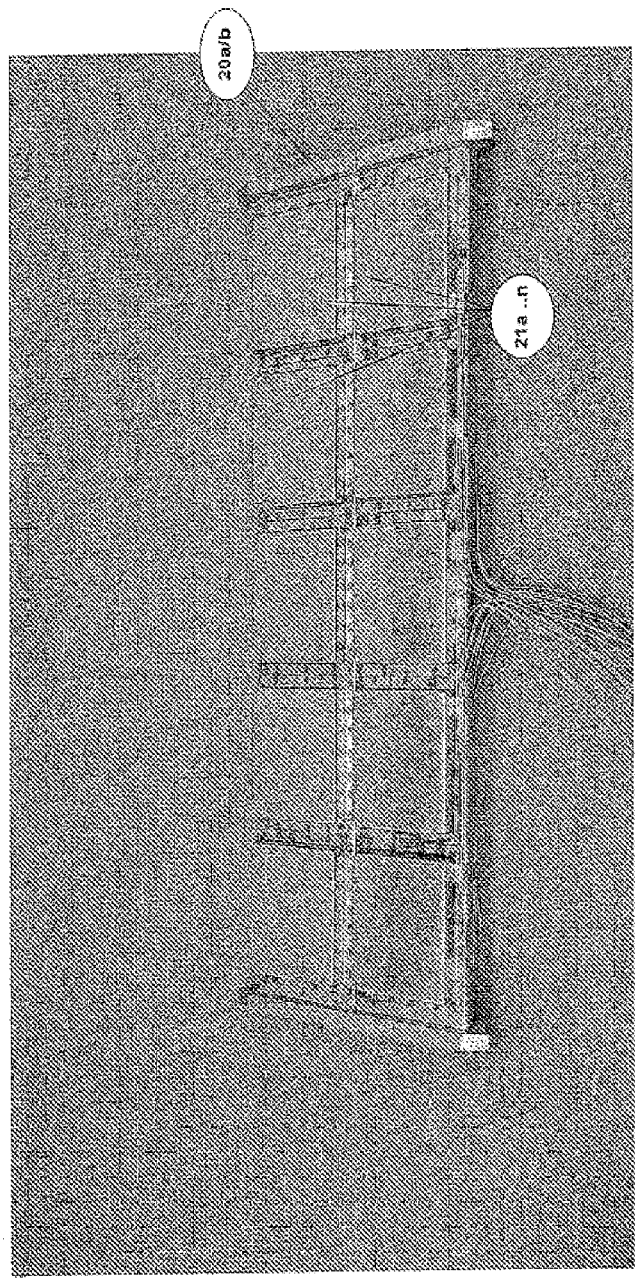
FIG. 5 shows a measurement structure for an exhaust duct according to the invention, which is fitted with modules on both sides.

An example of the exhaust train or exhaust duct according to the invention is illustrated in attached FIGS. 3 to 5.

FIG. 3 shows a schematic cross section through an exhaust train according to the invention having a layered arrangement of two exhaust ducts (20a, 20b). The thermoelectric modules (21a . . . n) are applied directly thereto and, with connected cooling plates (22a, 22b, 22c) arranged downstream, these in turn are used to dissipate the heat introduced from the gas duct and to maintain as large a temperature gradient as possible across the thermoelectric module.

It will be apparent from the figure that the thermoelectric modules (21a . . . n) are in direct contact on the hot side with the exhaust gas in the exhaust ducts (20a, 20b), while the cold side of the thermoelectric modules is cooled by means of a heat transfer medium (cooling plates 22a, 22b, 22c).

As can be seen from FIG. 3, five successive thermoelectric modules are provided above and below each exhaust duct. The cooling plates are in contact with a cooling medium, which flows in and out via the connections shown on the left in FIG. 3.

FIG. 4 shows an oblique view from above of an exhaust train of the kind illustrated schematically in FIG. 3. The cooling plates (22a . . . c) and the thermoelectric modules (21a . . . n), situated behind thermal insulation, are evident. Electrical connections for the thermoelectric modules can be seen above the upper cooling plate.

FIG. 5 shows a measurement structure for an exhaust duct (20a/b) according to the invention, which is fitted with modules (21a . . . n) on both sides. 10 thermoelectric modules with their electrical inputs and outputs are shown.

In the exhaust train illustrated, the heat transfer losses between the exhaust gas and the thermoelectric module are minimized, thus improving the efficiency of power generation.

The invention claimed is:

1. An exhaust train for an internal combustion engine, comprising:
   an integrated thermoelectric generator comprising at least one thermoelectric module comprising p- and n-legs, which are connected electrically in series and thermally in parallel, and comprise contacts that rest against support plates on the hot and cold side of the at least one thermoelectric module, and only one duct, through which exhaust gas flows and in which the at least one thermoelectric module is arranged so that a hot side of the at least one thermoelectric module is in direct contact with the exhaust gas, while a cold side of the at least one thermoelectric module is cooled by a heat transfer medium, wherein the at least one thermoelectric module is incorporated gastightly into the duct on the cold side of the at least one thermoelectric module, wherein the duct comprises a rectangular or a trapezoidal cross section with flat side walls, wherein the integrated thermoelectric generator is integrated into one or more of the flat side walls, wherein the at least one thermoelectric module is provided with a protective layer against excessive temperatures thereon, and wherein the protective layer comprises one or more metal alloys that form double, triple, quadruple or quintuple eutectics and having a melting point in a range of from 200° C. to 1800° C.

2. The exhaust train according to claim 1, wherein a flow of the exhaust gas impinges directly on a support plate on the hot side of the at least one thermoelectric module.

3. The exhaust train according to claim 1, wherein the at least one thermoelectric module is integrated into two opposite side walls of the duct.

4. The exhaust train according to claim 1, wherein the duct comprises fittings which improve flow of the exhaust gas to the at least one thermoelectric module.

5. The exhaust train according to claim 1, wherein a plurality of thermoelectric modules is present one behind the other, or adjacent to one another in one plane in the integrated thermoelectric generator, or both.

6. A motor vehicle in which the exhaust train according to claim 1, is installed therein.

7. A method comprising generating power from heat of the exhaust gas passing through the exhaust train according to claim 1.

8. An internal combustion engine comprising an integrated thermoelectric generator, the engine being connected to the exhaust train according to claim 1, in which said at least one thermoelectric module forms a part of the integrated thermoelectric generator.

9. The exhaust train according to claim 1, comprising from 3 to 100 thermoelectric modules.

10. The exhaust train according to claim 1, wherein the protective layer comprises an inorganic metal salt.

11. The exhaust train according to claim 1, wherein the protective layer encapsulates the at least one thermoelectric module.

12. An exhaust train for an internal combustion engine, comprising:

an integrated thermoelectric generator comprising at least one thermoelectric module comprising
  p- and n-legs, which are connected electrically in series and thermally in parallel, and comprise contacts that rest against support plates on the hot and cold side of the at least one thermoelectric module, and
a duct, through which exhaust gas flows and in which the at least one thermoelectric module is arranged so that a hot side of the at least one thermoelectric module is in direct contact with the exhaust gas, while a cold side of the at least one thermoelectric module is cooled by a heat transfer medium,
wherein the at least one thermoelectric module is incorporated gastightly into the duct on the cold side of the at least one thermoelectric module,
wherein the duct comprises a rectangular or a trapezoidal cross section with flat side walls,
wherein the integrated thermoelectric generator is integrated into one or more of the flat side wall,
wherein the at least one thermoelectric module is provided with a protective layer against excessive temperatures thereon, and
wherein the protective layer comprises one or more metal alloys that form double, triple, quadruple or quintuple eutectics and having a melting point in a range of from 200° C. to 1800° C.

* * * * *